(12) United States Patent
Haga et al.

(10) Patent No.: US 6,869,477 B2
(45) Date of Patent: Mar. 22, 2005

(54) CONTROLLED NECK GROWTH PROCESS FOR SINGLE CRYSTAL SILICON

(75) Inventors: Hiroyo Haga, Utsunomiya (JP); Makoto Kojima, Utsunomiya (JP); Shigemi Saga, Utsunomiya (JP)

(73) Assignee: MEMC Electronic Materials, Inc., St. Peters, MO (US)

( * ) Notice: Subject to any disclaimer, the term of this patent is extended or adjusted under 35 U.S.C. 154(b) by 26 days.

(21) Appl. No.: 10/204,654

(22) PCT Filed: Feb. 20, 2001

(86) PCT No.: PCT/US01/05379

§ 371 (c)(1),
(2), (4) Date: Nov. 4, 2002

(87) PCT Pub. No.: WO01/63022

PCT Pub. Date: Aug. 30, 2001

(65) Prior Publication Data

US 2003/0209186 A1 Nov. 13, 2003

(30) Foreign Application Priority Data

Feb. 22, 2000 (JP) .......................................... 2000-044369
May 10, 2000 (JP) .......................................... 2000-136811

(51) Int. Cl.[7] .............................................. C30B 15/22
(52) U.S. Cl. .............................. 117/13; 117/15; 117/20; 117/23; 117/35
(58) Field of Search .............................. 117/13, 15, 20, 117/23, 35

(56) References Cited

U.S. PATENT DOCUMENTS

| | | | |
|---|---|---|---|
| 5,183,528 A | * | 2/1993 | Baba et al. .................. 117/15 |
| 5,487,355 A | | 1/1996 | Chiou et al. |
| 5,628,823 A | | 5/1997 | Chandrasekhar et al. |
| 5,714,267 A | | 2/1998 | Machida et al. |
| 5,853,480 A | | 12/1998 | Kubota et al. |
| 5,871,578 A | | 2/1999 | Iino et al. |
| 5,879,448 A | | 3/1999 | Urano et al. |

(List continued on next page.)

FOREIGN PATENT DOCUMENTS

| | | |
|---|---|---|
| EP | 0 671 491 A1 | 9/1995 |
| EP | 0 747 512 A2 | 12/1996 |
| EP | 0 949 359 A1 | 10/1999 |
| JP | 4-104988 | 4/1992 |
| JP | 9-249492 | 9/1997 |
| JP | 9-255485 | 9/1997 |
| JP | 11-199384 A | 7/1999 |
| JP | 11-199384 | 7/1999 |
| WO | WO 99/07922 A1 | 2/1999 |
| WO | WO 01/27360 A1 | 4/2001 |

OTHER PUBLICATIONS

Hoshikawa, Keigo, et al., Dislocation–Free Czochralski Silicon Crystal Growth Without the Dislocation–Elimination–Necking Process, Japanese Journal of Applied Physics, Dec. 1, 1999, pp. L1369–L1371, vol. 38, No. 12A, Part 2, Tokyo, Japan.

Primary Examiner—Robert Kunemund
(74) Attorney, Agent, or Firm—Senniger Powers

(57) ABSTRACT

A process for preparing a single crystal silicon in accordance with the Czochralski method, is provided. More specifically, by quickly reducing the pull rate at least once during the growth of the neck portion of the single crystal ingot, in order to change the melt/solid interface shape from a concave to a convex shape, the present process enables zero dislocation growth to be achieved in a large diameter neck within a comparably short neck length, such that large diameter ingots of substantial weight can be produced safely and at a high throughput.

69 Claims, 6 Drawing Sheets

U.S. PATENT DOCUMENTS

| | | | |
|---|---|---|---|
| 5,885,344 A | * | 3/1999 | Kim et al. ..................... 117/13 |
| 5,935,321 A | | 8/1999 | Chiou et al. |
| 5,964,941 A | | 10/1999 | Iino et al. |
| 5,993,539 A | | 11/1999 | Izumi |
| 6,019,836 A | | 2/2000 | Izumi |
| 6,022,411 A | | 2/2000 | Kuramoto |
| 6,117,234 A | * | 9/2000 | Yamagishi .................. 117/218 |
| 6,171,391 B1 | | 1/2001 | Fuerhoff et al. |
| 6,197,111 B1 | | 3/2001 | Ferry et al. |
| 6,226,032 B1 | * | 5/2001 | Lees et al. ..................... 348/85 |

* cited by examiner

4B

CONTROLLED NECK GROWTH PROCESS FOR SINGLE CRYSTAL SILICON

CROSS-REFERENCE TO RELATED APPLICATIONS

This application is a 35 U.S.C. §371 national stage application based on PCT application Ser. No. PCT/US01/05379 filed Feb. 20, 2001, which claims priority from Japanese Patent Application No. 2000-136811 filed May 10, 2000 and Japanese Patent Application No. 2000-44369 filed Feb. 22, 2000. The texts of PCT application Ser. No. PCT/US01/05379, Japanese Patent Application No. 2000-136811 and Japanese Patent Application No. 2000-44369 are hereby incorporated herein by reference in their entirety.

BACKGROUND OF THE INVENTION

The present invention generally relates to the preparation of semiconductor grade single crystal silicon, used in the manufacture of electronic components. More particularly, the present invention relates to a process for preparing a single crystal silicon ingot having a large diameter, in accordance with the Czochralski method, wherein the pull rate is varied during growth of a neck portion of the ingot in order to achieve dislocation-free growth over a reduced axial length.

Single crystal silicon, which is the starting material for most processes for the fabrication of semiconductor electronic components, is commonly prepared by the Czochralski ("Cz") method. In this method, polycrystalline silicon ("polysilicon") is charged to a crucible and melted, a seed crystal is brought into contact with the molten silicon and a single crystal is grown by slow extraction. As crystal growth is initiated, dislocations are generated in the crystal from the thermal shock of contacting the seed crystal with the melt. These dislocations are propagated throughout the growing crystal and multiplied unless they are eliminated in a neck region between the seed crystal and the main body of the crystal.

The conventional method of eliminating dislocations within a silicon single crystal (known as the Dash neck method) involves growing a neck having a small diameter (e.g. 2 to 4 mm) at a high crystal pull rate (e.g., as high as 6 mm/min.), to completely eliminate dislocations before initiating growth of the main body of crystal. Generally, dislocations can be eliminated in these small diameter necks after approximately 100 mm of neck is grown. Once the dislocations have been eliminated, the diameter of the crystal is enlarged, forming a crown or taper portion, until reaching the desired diameter of the cylindrical main body. The cylindrical main body of the crystal is then grown to have an approximately constant diameter by controlling the pull rate and the melt temperature while compensating for the decreasing melt level.

The neck, which is the weakest part of the silicon single crystal, can fracture during crystal growth, causing the body of crystal to drop into the crucible. Thus, conventional crystals having a Dash neck are typically grown to a weight of 100 kg or less to minimize stress on the neck. However, in recent years, progress in the semiconductor industry has created an ever-increasing demand for larger silicon wafers of a high quality. Particularly, more highly integrated semiconductor devices have resulted in increased chip areas and a demand for the production of silicon wafers having a diameter of 200 mm (8 inches) to 300 mm (12 inches) or more. This has resulted in the need for more effective neck growth processes which enable the elimination of dislocations and which prevent neck fractures, while supporting the growth of single crystal silicon ingots weighing up to 300 kg or more.

A general solution for preventing neck fractures in larger crystals is to increase the neck diameter. However, large diameter necks are generally undesirable, as they require larger seed crystals, which in turn produce a higher density of slip dislocations when contacted with the silicon melt. Thus, larger diameter neck portions require increased length, typically 150 mm or more, and thus additional process time, to effectively eliminate slip dislocations.

In order to minimize the generation of slip dislocations in a larger diameter Dash neck, Japanese laid-open application (Kokai) No. 4-104988 proposes a process using a seed crystal having a unique, conical shape at its apex. However, the unique seed crystal is complicated and expensive to process. Because the seed crystal is unique, a new seed crystal is needed for each crystal pull, regardless of whether dislocation-free growth was achieved. Thus, changing the seed crystal requires excessive process downtime, which adversely affects productivity. Furthermore, the process employs a heater embedded in the seed crystal holder. Having such a heater makes it more difficult to form a temperature gradient between the seed crystal and the neck portion, which requires the single crystal to be pulled at an extremely slow rate.

Another process for eliminating dislocations in a larger diameter Dash neck is disclosed in Japanese laid-open application (Kokai) No. 11-199384. Specifically, the application discloses a process whereby the length of the neck required to eliminate slip dislocations is shortened by repeatedly changing the neck diameter. The neck therefore has alternating sections of increased and decreased diameter, the reference describing the increased portion as having a diameter at least twice that of the decreased portion. However, while this process is said to provide a shorter length neck for growing large diameter silicon single crystals, the process is complicated and difficult to control because of the large difference in diameter between the increased and decreased portions, and because the target diameter of the neck must be constantly changed.

In view of the forgoing, it can be seen that a need continues to exist for a process that enables large diameter ingots of substantial weight to be grown by means of a neck having a comparably large diameter but short length.

SUMMARY OF THE INVENTION

Among the several features of the invention, therefore, may be noted the provision of a single crystal silicon ingot having a large diameter or mass, as well as a process for the production thereof; the provision of such a process wherein the throughput and yield are increased; the provision of such process wherein the ingot has a large diameter neck; the provision of such a process wherein slip dislocations are eliminated in the neck over a substantially reduced length; the provision of such a process wherein the diameter of the neck is substantially constant; and, the provision of such a process wherein a standard seed crystal is used.

Briefly, therefore, the present invention is directed to a process for eliminating dislocations in a neck of a single crystal silicon ingot, grown in accordance with the Czochralski method. The process comprises: (i) heating polycrystalline silicon in a crucible to form a silicon melt; (ii) contacting a seed crystal to the melt until the seed begins to melt, forming dislocations therein; (iii) withdrawing the seed crystal from the melt at a growth rate $R_1$ to form a first segment of a neck having a diameter of at least about 5 mm; (iv) decreasing the growth rate $R_1$ to a growth rate $R_2$ to form a second segment of a neck having a diameter of at least about 5 mm; and, (v) increasing the growth rate $R_2$ to a growth rate $R_3$ to form an additional segment of a neck having a diameter of at least about 5 mm; wherein the rate $R_2$ is at least about 25% less than the rate $R_1$, and wherein dislocations are eliminated in the neck within an axial length of less than about 150 mm.

The present invention is further directed to a process for eliminating dislocations in a neck of a single crystal silicon ingot, grown in accordance with the Czochralski method. The process comprises: (i) heating polycrystalline silicon in a crucible to form a silicon melt; (ii) contacting a seed crystal to the melt until the seed crystal begins to melt, forming dislocations therein; (iii) withdrawing the seed crystal from the melt to grow a neck portion of the ingot, the neck having a diameter of at least about 5 mm and a length of less than about 150 mm, at a growth rate which changes to cause a melt/solid interface shape to change from concave to convex at least once over the length of the neck, in order to eliminate dislocations therein; (iv) growing an outwardly flaring seed-cone adjacent the neck portion of the ingot; and, (v) growing a main body adjacent the outwardly flaring seed-cone, the body having a nominal diameter of at least about 150 mm, 200 mm or 300 mm.

The present invention is still further directed to a silicon single crystal which comprises: (i) a neck having an average diameter of at least about 5 mm, a length of less than about 150 mm, and comprising an upper portion having dislocations and a lower portion which is free of dislocations; (ii) a seed cone adjacent the lower portion of the neck; and, (iii) a main body adjacent the seed cone having a nominal diameter of at least about 150 mm.

Other objects and features of this invention will be in part apparent and in part pointed out hereinafter.

DETAILED DESCRIPTION OF THE PREFERRED EMBODIMENTS

In accordance with the process of the present invention, it has been discovered that slip dislocations can be eliminated in the neck portion of a single crystal silicon ingot, grown in accordance with the Czochralski method, over a much shorter length or distance, even for ingots having a large diameter and substantial weight. More specifically, it has been discovered that, in comparison to conventional methods for growing large diameter and/or large mass single crystal silicon ingots, the length over which slip dislocations are eliminated in the neck of a single crystal silicon ingot, even a neck having a large diameter, can be significantly reduced by quickly changing the crystal pull rate from a high rate to a low rate; that is, dislocations can be removed by drastically reducing the pull rate at least once during neck growth.

Figure 1:
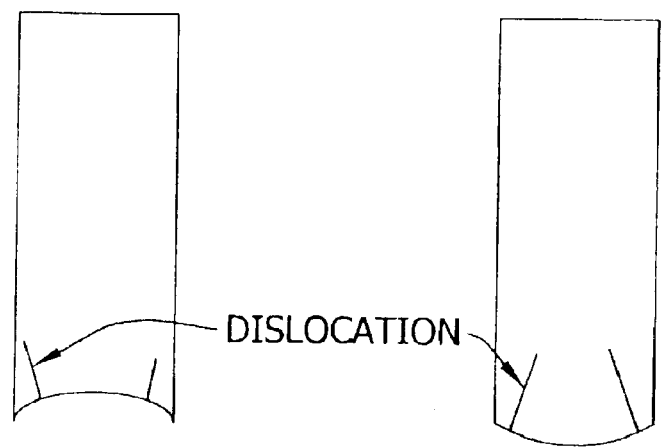
FIG. 1 is a diagram generally illustrating the direction of slip dislocation growth as the shape of the melt/solid interface changes from concave (e.g., "normal S/L") to convex (e.g., "low S/L").

Referring now to FIG. 1, it is generally believed that, for standard growth processes wherein a normally high pull rate is employed during neck growth (e.g., greater than about 1 mm/min.), dislocations grow vertically in a generally inward direction toward the center of the neck due to the concave nature of the melt/solid interface. As a result, these dislocations continue to grow along the length of the neck until the diameter of the neck is so small that the dislocations are eliminated. For large diameter necks, such as those needed for large diameter, heavy ingots, the length of the neck which must be grown to remove these dislocations is significant (e.g., about 150 mm or more).

Without being held to any particular theory, it is generally believed that the length needed to achieve dislocation-free growth can be substantially reduced by briefly, and preferably repeatedly, changing the shape of the melt/solid interface from concave to convex, by means of substantially decreasing the pull rate. By quickly changing the shape of the melt/solid interface from concave to convex, the dislocations, present at a generally vertical angle with the interface as described above, are more effectively concentrated at the circumferential edge of the neck as shown in FIG. 1, which facilitates dislocation removal. Thus, changing the interface shape results in the elimination of dislocations over a much shorter axial distance or length (e.g., less than about 150 mm) for large diameter, heavy ingots.

Accordingly, unlike existing Dash-neck processes, wherein (i) relatively small diameter ingots (e.g., less than about 150 or even 100 mm) are grown by a process wherein fast pull rates (e.g., about 6 mm/min. or more) are employed during growth of a neck having a diameter of less than about 4 mm (e.g., from about 2–4 mm) and a length of less than about 100 mm, or (ii) larger diameter ingots (e.g., greater than about 150 mm) are grown by various processes wherein the neck has a large diameter (e.g., greater than about 5 mm) and a length of greater than about 150 mm, the present invention enables the safe and efficient growth of heavy, large diameter single crystal silicon ingots by means of a process wherein a large diameter neck having a comparably short length is formed. More specifically, as further described herein, the process of the present invention involves changing or cycling the pull rate at least once during neck growth in order to form a dislocation-free neck having a diameter of greater than about 5 mm (e.g., about 6 mm, 8 mm, 10 mm or more) and a length of less than about 150 mm (e.g., less than about 125 mm, 100 mm, 90 mm, 80 mm or less), which is capable of supporting large diameter (e.g., about 200, 300 mm or more), heavy weight (e.g., about 100, 200, 300, 400 kilograms or more) single crystal silicon ingots.

In this regard it is to be noted that, while it may be preferred to have the largest diameter and shortest neck possible (e.g., about 8 or 10 mm and 100 mm, respectively), in order to increase strength and decrease process times), particularly for higher weight ingots (e.g., about 200 or 300 Kg), in some instances as the diameter increases the length may also need to be increased in order to eliminate dislocations (e.g., about 10 or 12 mm and about 125 mm or more, respectively). However, it is to be noted that process conditions can be optimized in order to achieve large diameter, dislocation-free necks (e.g., 10 mm, 12 mm or more) over relatively short lengths (e.g., less than 100 mm or even 80 mm.)

Figure 2:
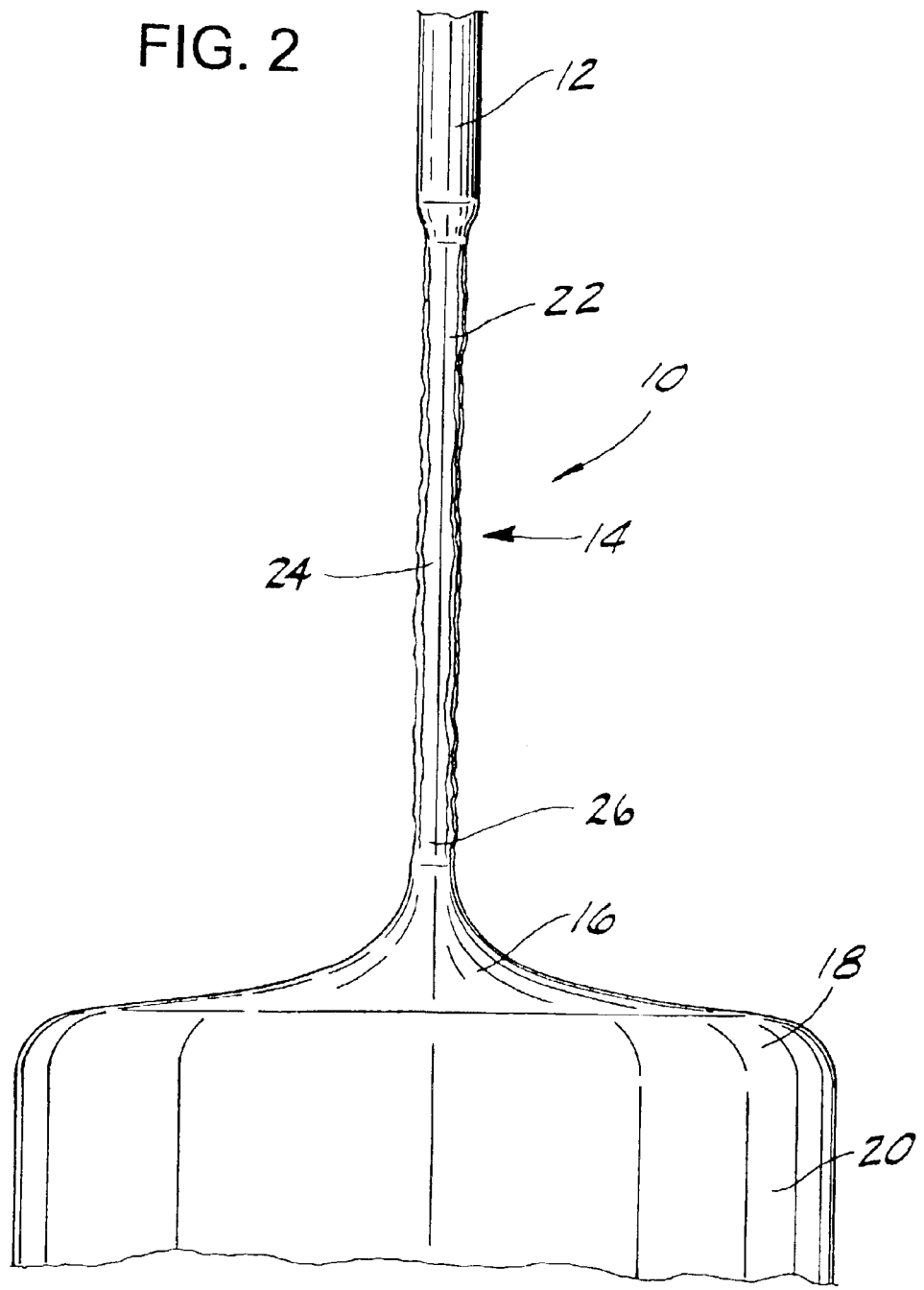
FIG. 2 is a vertical section illustrating the upper region of a single crystal generally embodying the present invention.

In accordance with the present process, and the Czochralski method generally, and referring now to FIG. 2, there is shown a single crystal 10 having a seed crystal 12, a neck 14, a seed cone 16, a shoulder 18 and a body 20. Once a dislocation-free seed crystal 12 is brought into contact with the surface of the molten semiconductor material, such as silicon, by varying the pull or growth rate, a neck 14 is formed which typically has: (i) an upper portion 22, grown beneath the seed crystal having dislocations (not shown); (ii) an intermediate portion 24, grown beneath the upper portion, having fewer dislocations; and, (iii) a lower portion 26, grown beneath the intermediate portion, which is free of dislocations. Generally speaking, as further described herein, the diameter of the neck remains substantially constant over its length; that is, the diameter of the neck varies by less than about 15%, 10% or even 5% from the target or desired diameter over a length of the neck (e.g., over about the last 50%, 60%, 70%, 80%, 90%, 95% or more of the length of the neck).

In a first embodiment, an initial pull rate will be established which is sufficient to form a neck of the desired diameter (the precise diameter being at least in part dependent upon the target diameter and/or weight of the ingot to be grown). Typically, this rate will range from greater than about 1 to less than about 6 mm/min., with rates ranging from about 2 to about 5 mm/min. or even from about 3 to about 4 mm/min. being preferred in some embodiments. Generally, the pull rate is established to result in the melt/solid interface having a concave shape.

Once this growth rate is established, it is maintained for a time sufficient to form a segment or length of the neck. Typically, this initial rate is maintained for about 1 minute, 2 minutes, 5 minutes, 10 minutes or even more, while about the first 5%, 10%, 20% or more of the neck is formed. Stated another way, the initial rate is maintained while about 5, 10, 15, 20 or even 25 mm of the neck is grown.

After the initial period of neck growth is complete, the pull rate is rapidly decreased to a second pull rate which is sufficient to change the shape of the melt/solid interface from a concave to a convex shape. Typically, this involves significantly reducing the pull rate by at least about 25%, 40%, 60%, 80%, 90% or more. Typically, however, this second or "reduced" pull rate is less than about 1 mm/min., with rates of about 0.8 mm/min., 0.6 mm/min., 0.5 mm/min., 0.3 mm/min. or even less than about 0.2 mm/min. being employed in some instances. Accordingly, the pull rate is typically reduced by about 1 mm/min., 1.5 mm/min., 2 mm/min., 2.5 mm/min., 3 mm/min., 4 mm/min. or more. To ensure that the melt/solid interface changes from a concave to a convex shape, it is important that the pull rate be reduced quickly. For example, in some cases the pull rate will be reduced such that the second pull rate is achieved within about 60 seconds or less (e.g., about 50, 40, 30, 20 or even 10 seconds).

However, it is to be noted in this regard that the above pull rates are at least in part dependent upon the operating conditions employed for a given crystal puller. For example, depending upon the type of silicon to be formed and the type of puller employed, growth rates as high as about 8 or even 10 mm/min. may initially be used. Accordingly, the above rates (both high and low) should not be viewed in a limiting sense.

Once established, the reduced pull rate is maintained only for a short period of time; that is, in order to maximize the throughput of the process, the reduced pull rate is maintained only for a time which is sufficient to change the melt/solid interface shape to produce the outward directional growth of slip dislocations within the neck. Typically, however, this rate will be maintained while about 3%, 1% or less (e.g., less than about 0.5%, 0.2% or even 0.1%) of the overall neck is formed. Given the pull rates typically employed, this generally results in maintaining the reduced pull rate for less than about 5 minutes, 4 minutes, 2 minutes or even 1 minute, while less than about 5 mm, 1 mm or less (e.g., about 0.5 mm, 0.2 mm, 0.1 mm or less) of the neck is formed.

After this reduced pull rate is maintained for a given period of time, the pull rate is then rapidly increased, typically back to or near the initial pull rate. In some instances, the pull rate may then be maintained until neck growth is complete. However, in some instances, the pull rate may be maintained for a period of time, or a given length of neck, as described above, and then the rate is quickly reduced once again. Stated another way, after a period of growth at a slow or reduced rate, the rate increased and maintained once again for a few minutes (e.g., about 2 minutes, 5 minutes, 10 minutes or more), while another segment of the neck is formed (e.g., about 5%, 10%, 20% or more of neck length). The pull rate may then again be rapidly decreased to change the shape of the melt/solid interface, and to further concentrate slip dislocations at the circumferential edges of the neck, as described above.

The number of "cycles," wherein the pull rate is changed from a high pull rate to a reduced pull rate and back to a high pull rate (which may be the same or different that the prior, high pull rate) in order to rapidly change the melt/solid interface shape, can be optimized for a given crystal pulling process, taking into consideration such things as ingot diameter, weight, etc., to ensure that only the minimum number of cycles is used to achieved dislocation-free growth at the earliest stage possible (i.e., the shortest neck length possible), thus maximizing the throughput. In some embodiments, the number of cycles will range from about 1 to about 10 (e.g., about 2, 4, 6 or 8), from about 2 to about 8, or from about 4 to about 6.

As described above, the process of the present invention enables large diameter, dislocation-free ingots, of substantial weight, to be efficiently and safely produced by growing a neck of large diameter and comparably short length. The present invention is particularly beneficial in that, due to (i) the short period of time over which the pull rate is maintained at a reduced rate, and (ii) the rapid or quick changes between the high and reduced pull rates, the diameter of the neck remains substantially constant throughout the growth process (which enables a stronger neck to be formed). More specifically, in spite of the changes in pull rate during growth of the neck portion of the ingot, the diameter of the neck at these reduced rate transition sites typically changes by less than about 5%, 3%, 2% or even 1%; that is, the diameter of the neck at those segments grown at a reduced rate, relative to the diameter of the segments grown at the higher or typical growth rate, is substantially unchanged, increasing by less than about 5%, 3%, 2% or even 1%.

In accordance with a preferred embodiment of the present invention, wherein a neck ranging from about 5 to about 7 mm is grown at an initial or typical rate of from about 2 to about 5 mm/min., it has been found that the interface between the silicon melt and the seed crystal changes from a concave to a convex shape when the pull rate is reduced to about 0.8 mm/min. or less. Thus, in operation of the present invention, for growing a neck having a diameter of from about 5 to about 7 mm, the neck is grown at a typical growth rate of from about 2 to about 5 mm/min. for a period of time which is sufficient to form a neck segment at least about 10 mm long, preferably at least about 15 mm long, and more preferably at least about 20 mm long. After this segment has been grown, the pull rate is quickly decreased, typically in less than about 60 seconds and preferably in less than about 20 or even 10 seconds. The pull rate is reduced by at least about 1.5 mm/min., preferably about 2.5 mm/min., and most preferably about 3 mm/min. from the initial pull rate. Experience to-date suggests that for typical ingot growth, wherein the "high" pull rate ranges from about 2 to about 5 mm/min. and a neck diameter of about 5 to about 7 mm is desired, the reduced growth rate should be about 0.8 mm/min. or less, preferably 0.5 mm/min. or less, and most preferably 0.3 mm/min. or less. The reduced growth rate is maintained for about 1 to 5 minutes, and preferably from about 2 to 3 minutes, before returning to the high pull rate (i.e., back to the previous rate, or some rate within the "high" range).

The growth process according to the present invention can be applied to essentially any standard Cz growth method, as well as a magnetic field-applied Cz (MCz) method, wherein for example a lateral magnetic field or a magnetic cusp field is applied during crystal growth. In addition, the crystal orientation of the seed crystal is not narrowly critical (e.g., a crystal orientation of <100> or <111> may be used, for example).

Furthermore, seed crystals described as having an apex of at least about 7 mm in diameter at the beginning of the crystal pulling operation are preferred, in some embodiments. However, seed crystals less than about 7 mm in diameter may be used, provided that the diameter thereof is increased to at least about 7 mm before pulling (for example, by melting the apex of the seed crystal in the melt); that is, according to the present invention, it is preferred that the diameter of the apex of the seed crystal be not less than about 7 mm when the pulling operation is initiated.

It is to be noted that, unless specifically identified herein, the remainder of the operating conditions to be employed may be in accordance with typical operating conditions suitable for Cz crystal growth.

Furthermore, it should be noted that references to "first," "typical" or "initial" pull rates should not be construed as only limited to pull rates employed at the initiation of the crystal growth process. Rather, such terms are intended to refer to any pull rate employed during the crystal growth process other than the "reduced" pull rate, which is specifically employed when altering the melt/solid interface from a concave to a convex shape. More specifically, generally speaking, it is to be noted that the process of the present invention utilized a rapid change in pull rate during neck growth in order to change the melt/solid interface shape and eliminate dislocations from the neck. While typically this approach involves rapidly decreasing the pull rate from a high rate to a low rate and back to a high rate, in some embodiments neck growth may initially be at a low rate and then rapidly increased to a high rate.

EXAMPLES

The following Examples illustrate one approach that may be used to carry out the process of the present invention. Accordingly, these should not be interpreted in a limiting sense.

Example 1

This Example demonstrates the effect of eliminating dislocations when the neck portion of a silicon single crystal is grown in accordance with the present invention. In this Example, the growth of the single crystal was performed using a crucible 600 mm (24 inches) in diameter having a starting material capacity of 140 kg.

Figure 3:
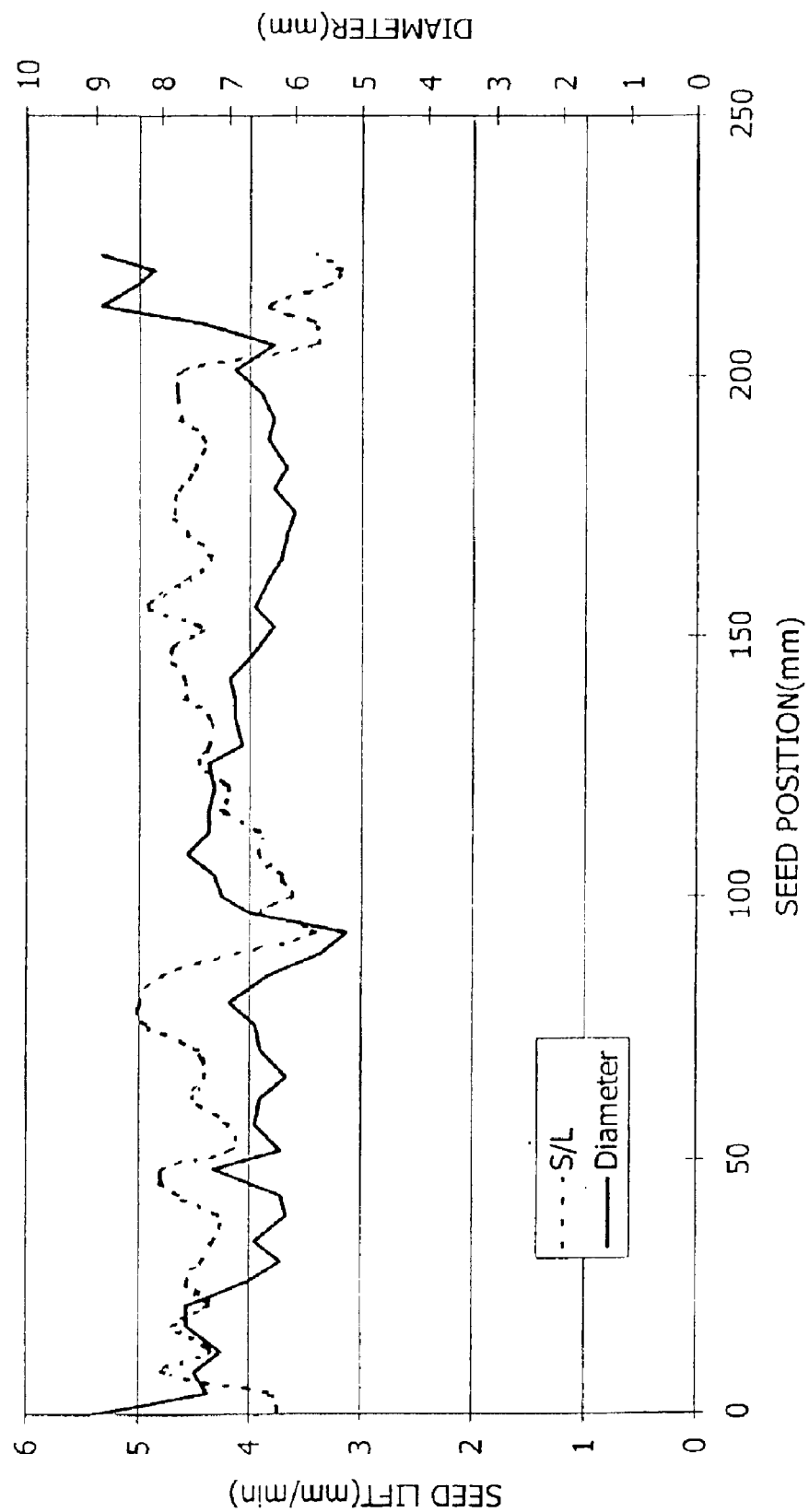
FIG. 3 is a graph showing the crystal growth rate ("S/L") and the neck diameter during a necking operation performed in accordance with one embodiment of the present invention and as further described in Example 1.

The growth of the neck portion was begun using a seed crystal having a bottom of 12 mm by 12 mm. A silicon single crystal of 200 mm in diameter was pulled at a growth rate of 4 mm/min., which was sufficient to form a neck portion greater than 5.7 mm in diameter as shown in FIG. 3. After the neck portion had grown to approximately 20 mm in length, the growth rate was reduced to 0.2 mm/min. for 1 minute. This procedure (growing 20 mm of crystal at 4 mm/min. and then growing the neck at a reduced growth rate of 0.2 mm/min. for 1 minute) was repeated a total of ten times.

Figure 4A:
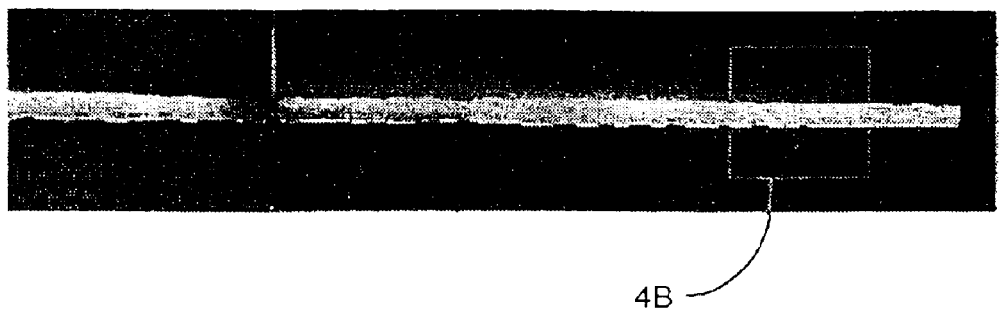
FIGS. 4A and 4B are photographs of x-ray topographs of a neck portion of a silicon single crystal grown in accordance with one embodiment of the present invention and as further described in Example 1, FIG. 4B being a photograph of a magnified portion of 4A.
Figure 4B:
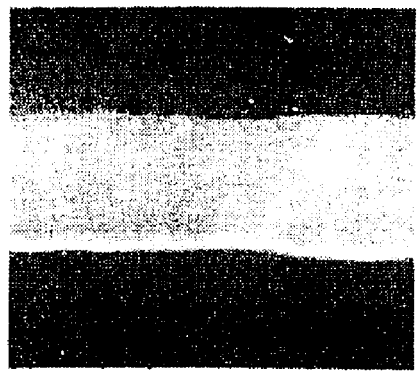

After examining the neck portion by x-ray topography, it was determined that substantially all slip dislocations were eliminated in the neck portion immediately after the growth rate was reduced a first time (after about 20 mm of neck length), as shown by the x-ray topographs of FIGS. 4A and 4B. Accordingly, it is to be noted from this Example that while in some instances the pull rate may be cycled from high to low to high a number of times during neck growth in order to eliminate dislocations, it is possible to eliminated essentially all slip dislocation after only one cycle (or melt/solid interface change).

Example 2

Figure 5:
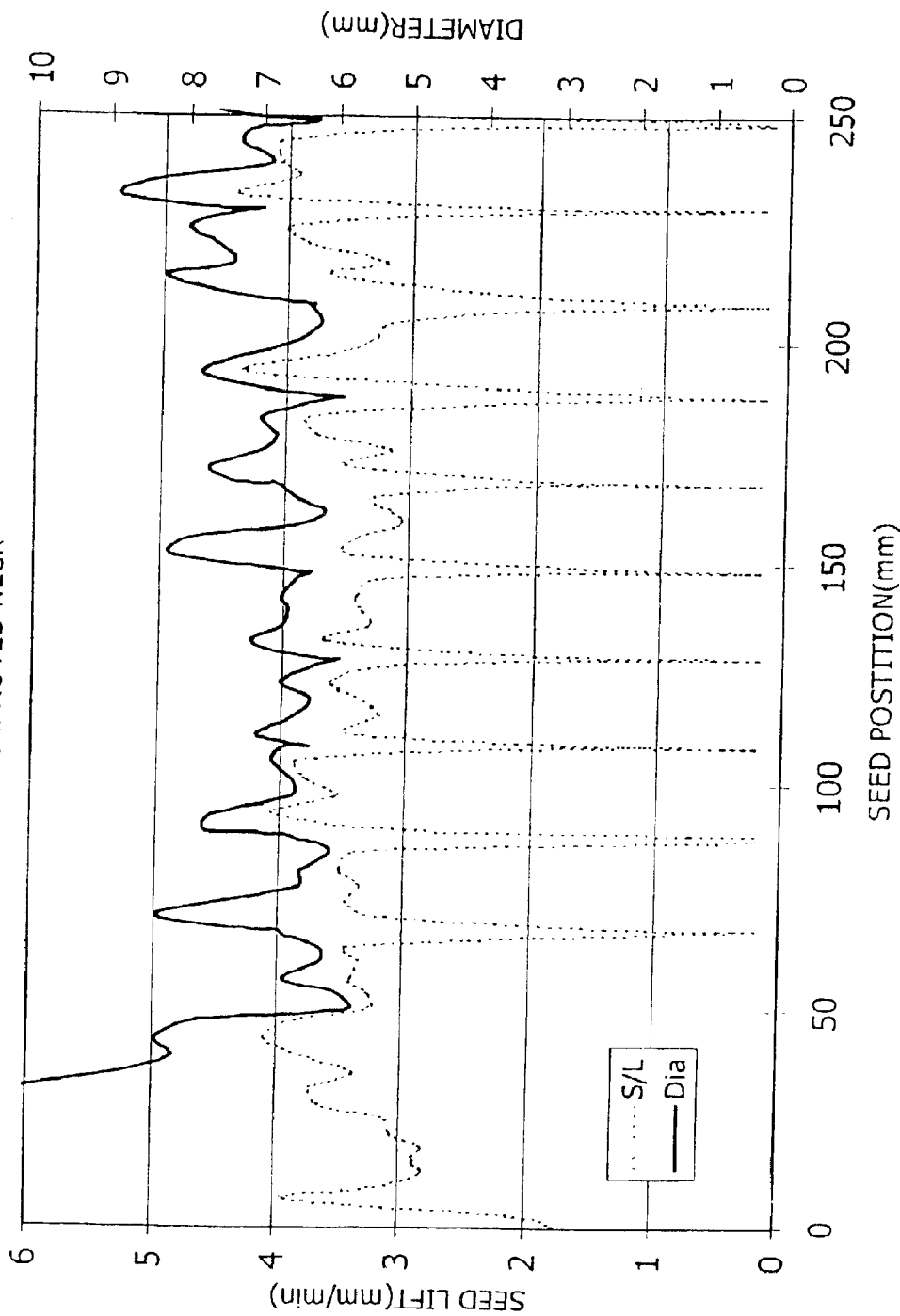
FIG. 5 is a graph showing the crystal growth rate ("S/L") and the neck diameter during a conventional necking process as described in Example 2; and, FIGS. 6A and 6B are photographs of x-ray topographs of a neck portion of a silicon single crystal grown by a conventional necking process as described in Example 2, FIG. 6B being a photograph of a magnified portion of 6A.
Figure 6A:
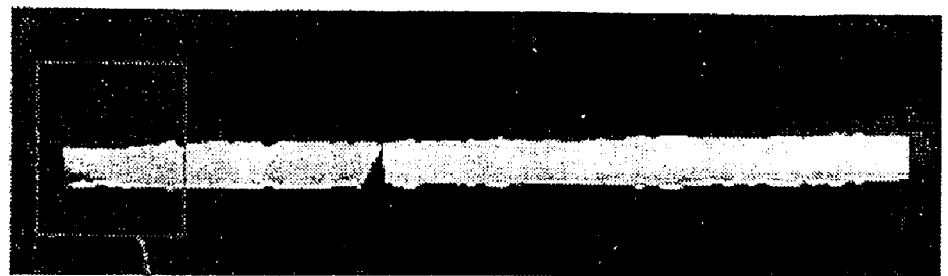
Figure 6B:
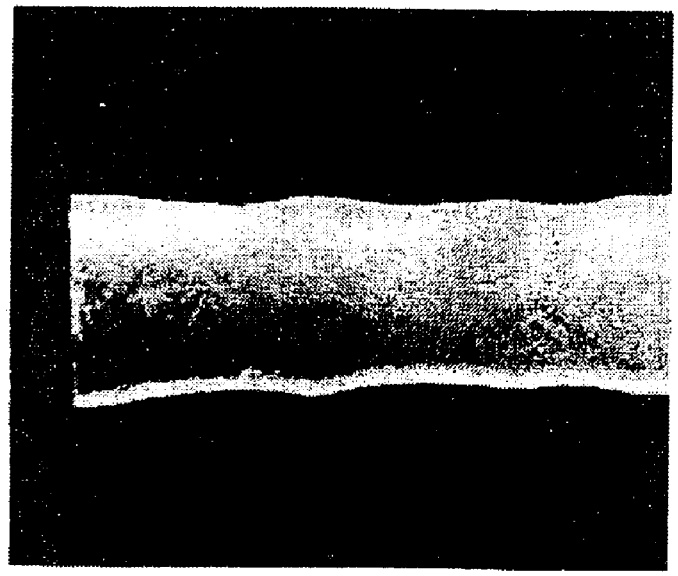

For comparison purposes, this Example shows a conventional operation for forming a neck portion of a silicon single crystal. The Example was performed using a crucible of 600 mm (24 inches) in diameter having a starting material capacity of 140 kg and a seed crystal having a bottom of 12 mm by 12 mm as in Example 1. A 200 mm diameter silicon single crystal was grown at a growth rate of approximately 4 mm/min. to form a neck portion having a diameter greater than 5.2 mm as shown in FIG. 5. As shown by x-ray topographs of the neck portion in FIGS. 6A and 6B, the length of the neck portion was required to be between 150 to 200 mm before slip dislocations were eliminated.

Example 3

A silicon single crystal was grown as in the above Examples except that a magnetic field of 3,000 gauss was applied laterally to the surface of the crucible during crystal growth. In this Example, the silicon single crystal of 200 mm in diameter was pulled at a growth rate ranging from 2 to 5 mm/min., which was sufficient to form a neck portion of approximately 6.5 mm in diameter at the apex of the seed crystal. After the neck portion had grown to approximately 20 mm in length, the growth rate was reduced to 0.2 mm/min. for 2 minutes. This procedure (growing 20 mm of neck at a typical growth rate of from 2 to 5 mm/min. followed by growing the neck at a reduced growth rate of 0.2 mm/min. for 2 minutes) was repeated a total of five times. In this process, the growth rate was changed between the typical or initial growth rate and the reduced growth rate in 15 seconds or less. The results obtained were as follows:

1. Among silicon single crystals grown with the application of a magnetic field as described above, only 3% had dislocations in the neck portion at a distance of 100 mm from the apex of the seed crystal and all silicon single crystals were dislocation-free at a distance of less than about 150 mm from the apex of the seed crystal. This compared favorably to silicon single crystals grown by the process of the invention in which a magnetic field was not applied (as described in Example 1), wherein only 2% of the silicon single crystals grown had dislocations in the neck portion at a distance of 100 mm, with all crystals being dislocation-free at a distance of less than about 150 mm from the apex of the seed crystal.

2. In comparison, for silicon single crystals grown by a conventional necking process wherein the growth rate was maintained at 2 to 5 mm/min. and a magnetic field of 3,000 gauss was applied from the lateral direction during crystal growth, nearly 100% of the silicon single crystals had dislocations in the neck portion at a distance of 100 mm from the apex of the seed crystal. Further, at a distance between 100 and 200 mm from the apex of the seed crystal, nearly 100% of the silicon single crystals still had dislocations.

3. As another comparison, for silicon single crystals grown in accordance with a conventional necking process wherein the growth rate was maintained at 2 to 5 mm/min. during crystal growth without application of a magnetic field, about 90% of the silicon single crystals had dislocations in the neck portion at a distance of 100 mm from the apex of the seed crystal. Likewise, at a distance of 200 mm from the apex of the seed crystal, 4% of the silicon single crystals still had dislocations in the neck.

Therefore, as the above examples demonstrate, the process of the present invention can remove dislocations from a large diameter neck in a comparably short length, thereby producing dislocation-free silicon single crystals having a large diameter and heavy weight.

In view of the foregoing, it can be seen that by quickly reducing the pull rate at least once during neck growth as described above, zero dislocation growth can be achieved in a large diameter neck at an earlier stage (i.e., within a shorter neck length) than has heretofore been possible. As a result, the throughput of large diameter and high weight ingots can be increased.

What is claimed is:

1. A process for eliminating dislocations in a neck of a single crystal silicon ingot, grown in accordance with the Czochralski method, the process comprising:

heating polycrystalline silicon in a crucible to form a silicon melt;

contacting a seed crystal to the melt until the seed begins to melt, forming dislocations therein;

withdrawing the seed crystal from the melt at a growth rate $R_1$ to form a first segment of a neck having a diameter of at least about 5 mm;

decreasing the growth rate $R_1$ to a growth rate $R_2$ to form a second segment of a neck having a diameter of at least about 5 mm; and, increasing the growth rate $R_2$ to a growth rate $R_3$ to form an additional segment of a neck having a diameter of at least about 5 mm;

wherein the growth rate $R_2$ is at least about 25% less than the growth rate $R_1$, wherein the neck has a substantially constant diameter, and wherein dislocations are eliminated in the neck within an axial length of less than about 150 mm.

2. The process of claim 1 further comprising, after neck growth is complete:

growing an outwardly flaring seed-cone adjacent the neck; and, growing a body adjacent the outwardly flaring seed-cone, the body having a nominal diameter of at least about 150 mm.

3. The process of claim 2 wherein the body has a nominal diameter of at least about 200 mm.

4. The process of claim 2 wherein the body has a nominal diameter of at least about 300 mm.

5. The process of claim 2 wherein the body has a weight of at least about 100 kilograms.

6. The process of claim 2 wherein the body has a weight of at least about 200 kilograms.

7. The process of claim 2 wherein the body has a weight of at least about 300 kilograms.

8. The process of claim 3 wherein the body has a weight of at least about 100 kilograms.

9. The process of claim 3 wherein the body has a weight of at least about 200 kilograms.

10. The process of claim 3 wherein the body has a weight of at least about 300 kilograms.

11. The process of claim 1 wherein dislocations are eliminated in the neck within an axial length of less than about 125 mm.

12. The process of claim 1 wherein dislocations are eliminated in the neck within an axial length of less than about 100 mm.

13. The process of claim 1 wherein growth rate $R_2$ is at least about 40% less than growth rate $R_1$.

14. The process of claim 1 wherein growth rate $R_2$ is at least about 80% less than growth rate $R_1$.

15. The process of claim 1 wherein growth rate $R_2$ is at least about 1.5 mm/min. less than growth rate $R_1$.

16. The process of claim 1 wherein growth rate $R_2$ is at least about 2.5 mm/min. less than growth rate $R_1$.

17. The process of claim 1 wherein growth rate $R_2$ is less than about 0.8 mm/min.

18. The process of claim 1 wherein growth rate $R_2$ is less than about 0.5 mm/min.

19. The process of claim 1 wherein growth rate $R_1$ ranges from about 2 to about 5 mm/min.

20. The process of claim 1 wherein growth rate $R_1$ is decreased to growth rate $R_2$ in less than about 60 seconds.

21. The process of claim 1 wherein growth rate $R_1$ is decreased to growth rate $R_2$ in less than about 20 seconds.

22. The process of claim 1 wherein growth rate $R_2$ is maintained for a period of time ranging from about 2 to about 5 minutes.

23. The process of claim 1 wherein growth rate $R_2$ is maintained for less than about 3 minutes.

24. The process of claim 1 wherein growth rate $R_1$ and growth rate $R_3$ are about equal.

25. The process of claim 1 wherein, prior to formation of a seed-cone adjacent the neck, the cycle of changing the growth rate is repeated at least about 3 times.

26. The process of claim 1 wherein a magnetic field is applied during growth.

27. The process of claim 1 wherein the neck has a diameter of at least about 10 mm.

28. The process of claim 1 wherein the diameter of the first segment of the neck differs from the diameter of the second segment of the neck by less than about 5%.

29. The process of claim 1 wherein the diameter of the neck varies by less than about 10% over the last 75% of neck length.

30. The process of claim 1 wherein the diameter of the neck varies by less than about 5% over the last 75% of neck length.

31. A process for eliminating dislocations in a neck of a single crystal silicon ingot, grown in accordance with the Czochralski method, the process comprising:

heating polycrystalline silicon in a crucible to form a silicon melt;

contacting a seed crystal to the melt until the seed crystal begins to melt, forming dislocations therein;

withdrawing the seed crystal from the melt to grow a neck portion of the ingot, the neck having a diameter of at least about 5 mm and a length of less than about 150 mm, at a growth rate which changes to cause a melt/solid interface shape to change from concave to convex at least once over the length of the neck, in order to eliminate dislocations therein;

growing an outwardly flaring seed-cone adjacent the neck portion of the ingot; and, growing a main body adjacent the outwardly flaring seed-cone, the body having a nominal diameter of at least about 150 mm.

32. The process of claim 31 wherein the neck has a diameter of at least about 10 mm.

33. The process of claim 31 wherein the neck has a length of less than about 125 mm.

34. The process of claim 31 wherein the growth rate is changed from a first growth rate $R_1$, at which the interface is concave, to a second growth rate $R_2$, at which the interface is convex, in less than about 60 seconds.

35. The process of claim 34 wherein the growth rate is changed from $R_1$ to $R_2$ in less than about 30 seconds.

36. The process of claim 34 wherein growth rate $R_2$ is at least about 25% less than growth rate $R_1$.

37. The process of claim 34 wherein the rate $R_2$ is at least about 50% less than growth rate $R_1$.

38. The process of claim 34 wherein the growth rate $R_2$ is maintained for about 1 to about 3 minutes.

39. The process of claim 31 wherein the growth rate, after being changed to cause a change in the interface shape from concave to convex, is increased to change the interface shape from convex to concave.

40. The process of claim 39 wherein this cycle of changing the interface from concave to convex to concave is repeated at least about 3 times.

41. The process of claim 39 wherein the cycle of changing the interface from concave to convex to concave is repeated at least about 5 times.

42. The process of claim 31 wherein the convex interface shape is maintained for less than about 5 minutes.

43. The process of claim 31 wherein the convex interface shape is maintained for less than about 3 minutes.

44. The process of claim 31 wherein the diameter of the neck ranges from about 5 mm to about 7 mm.

45. The process of claim 31 wherein the seed crystal has a tip which is not less than about 12 mm$^2$.

46. The process of claim 31 wherein the growth rate at which the interface has a convex shape is less than about 0.8 mm/minute.

47. The process of claim 31 wherein the growth rate at which the interface has a convex shape is less than about 0.5 mm/minute.

48. The process of claim 31 wherein the difference between the growth rate at which the interface shape is concave and the growth rate at which the interface shape is convex is at least about 1 mm/minute.

49. The process of claim 31 wherein the difference between the growth rate at which the interface shape is concave and the growth rate at which the interface shape is convex is at least about 2 mm/minute.

50. The process of claim 31 wherein the seed crystal has a diameter of at least about 7 mm.

51. The process of claim 31 wherein the body has a nominal diameter of at least about 200 mm.

52. The process of claim 31 wherein the body has a nominal diameter of at least about 300 mm.

53. A silicon single crystal comprising:

a neck having a substantially constant diameter of at least about 5 mm, a length of less than about 150 mm, and comprising an upper portion having dislocations and a lower portion which is free of dislocations;

a seed cone adjacent the lower portion of the neck; and, a main body adjacent the seed cone having a nominal diameter of at least about 150 mm.

54. The silicon single crystal of claim 53 wherein the main body has a nominal diameter of at least about 200 mm.

55. The silicon single crystal of claim 53 wherein the main body has a nominal diameter of at least about 300 mm.

56. The silicon single crystal of claim 54 wherein the neck has an average diameter of at least about 7 mm.

57. The silicon single crystal of claim 54 wherein the neck has a length of less than about 125 mm.

58. The silicon single crystal of claim 54 wherein the neck has an average diameter of about 5 to about 7 mm and a length of less than about 100 mm.

59. The silicon single crystal of claim 54 wherein the neck has an average diameter ranging from about 10 mm to about 12 mm and a length ranging from about 100 mm to less than about 150 mm.

60. The silicon single crystal of claim 1 wherein the neck diameter varies by less than about 15% over the last 50% of the length of the neck.

61. The silicon single crystal of claim 54 wherein the neck diameter varies by less than about 15% over the last 75% of the length of the neck.

62. The silicon single crystal of claim 54 wherein the neck diameter varies by less than about 5% over the last 50% of the length of the neck.

63. The silicon single crystal of claim 54 wherein the neck diameter varies by less than about 5% over the last 75% of the length of the neck.

64. A process for eliminating dislocations in a neck of a single crystal silicon ingot, grown in accordance with the Czochralski method, the process comprising:

heating polycrystalline silicon in a crucible to form a silicon melt;

contacting a seed crystal to the melt until the seed begins to melt, forming dislocations therein;

withdrawing the seed crystal from the melt at a growth rate $R_1$ to form a first segment of a neck having a diameter of at least about 5 mm;

decreasing the growth rate $R_1$ to a growth rate $R_2$ to form a second segment of a neck having a diameter of at least about 5 mm; and, increasing the growth rate $R_2$ to a growth rate $R_3$ to form an additional segment of a neck having a diameter of at least about 5 mm;

wherein the growth rate $R_2$ is at least about 25% less than the growth rate $R_1$,
wherein the diameter of the neck varies by less than about 15% over the last 50% of the length of the neck, and wherein dislocations are eliminated in the neck within an axial length of less than about 150 mm.

65. The process of claim 64 neck varies by less than about 15% over the last 70% of the length of the neck.

66. The process of claim 64 the neck varies by less than about 15% over the last 90% of the length of the neck.

67. The process of claim 64 further comprising, after neck growth is complete:

growing an outwardly flaring seed-cone adjacent the neck; and, growing a body adjacent the outwardly flaring seed-cone, the body having a nominal diameter of at least about 150 mm.

68. The process of claim 67 wherein the body has a nominal diameter of at least about 200 mm.

69. The process of claim 67 wherein the body has a nominal diameter of at least about 300 mm.

* * * * *

UNITED STATES PATENT AND TRADEMARK OFFICE
CERTIFICATE OF CORRECTION

PATENT NO.   : 6,869,477 B2
DATED        : March 22, 2005
INVENTOR(S)  : Hiroyo Haga et al.

It is certified that error appears in the above-identified patent and that said Letters Patent is hereby corrected as shown below:

Column 12,
Line 38, "claim 1" should read -- claim 54 --.

Column 13,
Line 7, "claim 64" should read -- claim 64 wherein the --.
Line 9, "claim 64" should read -- claim 64 wherein --.

Signed and Sealed this

Sixth Day of December, 2005

JON W. DUDAS
*Director of the United States Patent and Trademark Office*